United States Patent [19]
Tamura et al.

[11] Patent Number: 4,672,557
[45] Date of Patent: Jun. 9, 1987

[54] AUTOMATIC ACCURATE ALIGNMENT SYSTEM

[75] Inventors: Shinichi Tamura, Nishinomiya; Masanori Uga, Hachioji, both of Japan

[73] Assignee: Disco Abrasive Systems, Ltd., Tokyo, Japan

[21] Appl. No.: 551,820

[22] Filed: Nov. 15, 1983

[30] Foreign Application Priority Data

Mar. 26, 1983 [JP] Japan ................................. 58-51019
Sep. 5, 1983 [JP] Japan ................................ 58-162031

[51] Int. Cl.⁴ ........................ G06F 15/60; G01B 11/00
[52] U.S. Cl. ................................... 364/490; 250/202; 356/401; 364/559
[58] Field of Search ............... 364/475, 490, 491, 558, 364/559; 356/399–401; 250/202, 557; 73/104; 358/101

[56] References Cited
U.S. PATENT DOCUMENTS

| | | | |
|---|---|---|---|
| 3,885,140 | 5/1975 | Schlatter | 364/558 X |
| 4,103,998 | 8/1978 | Nakazawa et al. | 364/490 X |
| 4,213,117 | 7/1980 | Kembo et al. | 364/490 X |
| 4,238,780 | 12/1980 | Doemans | 364/490 X |
| 4,301,470 | 11/1981 | Pagany | 364/559 X |
| 4,328,553 | 5/1982 | Fredriksen et al. | 364/559 |
| 4,406,949 | 9/1983 | Spohnheimer | 356/400 X |
| 4,450,579 | 5/1984 | Nakashima et al. | 364/490 X |

Primary Examiner—Felix D. Gruber
Assistant Examiner—Kevin J. Teska
Attorney, Agent, or Firm—Beveridge, DeGrandi & Weilacher

[57] ABSTRACT

An accurate alignment system for positioning at a required position an object to be worked which has on its surface straight-line areas whose image density changes relatively abruptly at their both side edges. The system comprises holding means for holding the object to be worked, moving means for moving the holding means, camera means for taking at least a part of the image of the surface of the object held on the holding means and outputting analog signals showing the densities of x-y matrix arrayed pixels, A/D converter means for converting the analog signals output by the camera means into multi-value digital signals, operation means for performing a mathematical operation on the multi-value digital signals to produce binary digital signals, detecting means for detecting the position of at least one side edge of each straight-line area and thus the position of the straight-line area on the basis of the binary digital signals, and movement control means for actuating the moving means according to the detected position of the straight-line area and thus positioning the object held on the holding means at the required position.

28 Claims, 20 Drawing Figures

FIG. 5-A
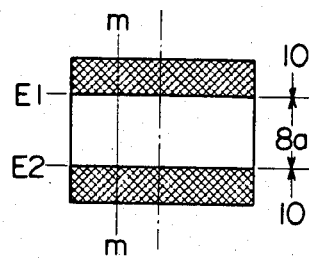
FIG. 5-B
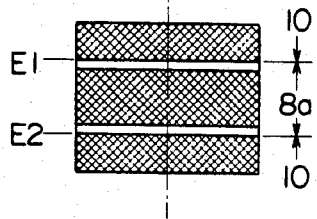
FIG. 6-A
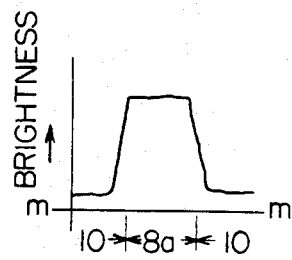
FIG. 6-B
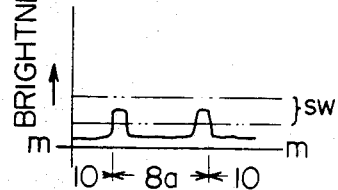
FIG. 6-C
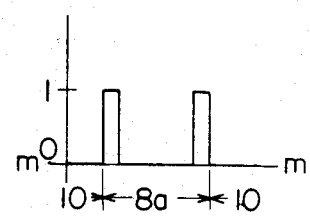

FIG. 7-A
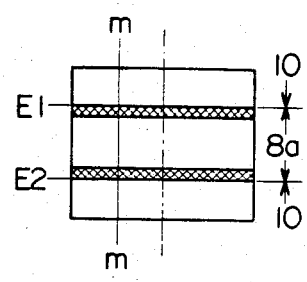
FIG. 7-B
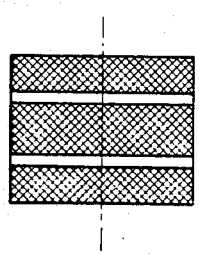
FIG. 8-A
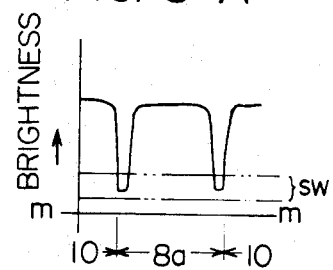
FIG. 8-B
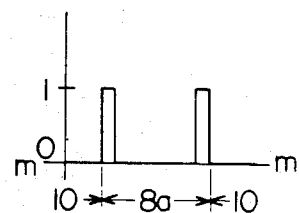

FIG. 9-A
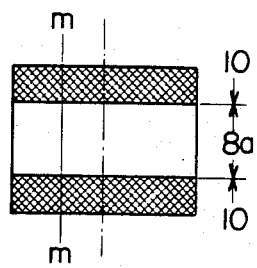
FIG. 9-B
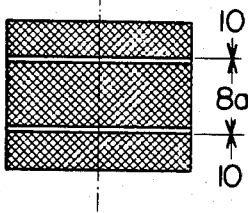
FIG. 10-A
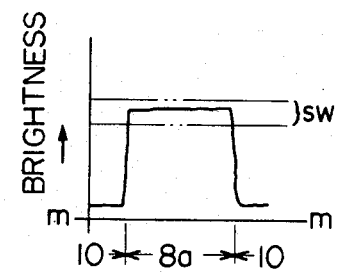
FIG. 10-B
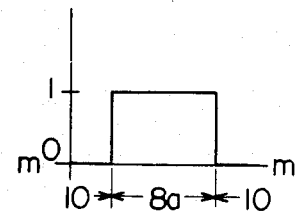
FIG. 10-C
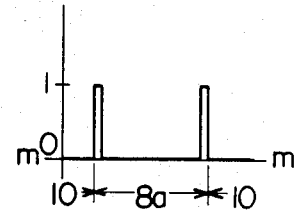

AUTOMATIC ACCURATE ALIGNMENT SYSTEM

FIELD OF THE INVENTION

This invention relates to an automatic accurate alignment system which is suitable, although not exclusively, for the automatic accurate alignment of a semiconductor wafer having a given circuit pattern applied to its surface.

DESCRIPTION OF THE PRIOR ART

As is well known, a plurality of straight-line areas with predetermined widths which are arranged in a lattice pattern at predetermined intervals exist on the surface of a semiconductor wafer. These straight-line areas are generally called streets. A circuit pattern is applied to a plurality of rectangular areas defined by these straight-line areas. The semiconductor wafer is cut at these straight-line areas to separate the individual rectangular areas having a circuit pattern applied thereto. These separated rectangular areas are generally called chips. It is important that cutting of the semiconductor wafer should be carried out fully accurately at the aforesaid straight-line areas. The width of each of the straight-line areas is very narrow, and is generally about several tens of μm. Hence, when such a semiconductor wafer is to be cut by a cutting means such as a diamond blade, it is necessary to align the semiconductor wafer extremely accurately with respect to the cutting means.

Automatic accurate alignment systems of various types have already been proposed and come into commercial acceptance to position a semiconductor wafer fully precisely at a required position for cutting purposes or otherwise. Such automatic accurate alignment systems are generally adapted to detect fully accurately the positions of the straight-line areas existing on the surface of a semiconductor wafer held by a holding means and move the holding means on the basis of the detected positions thereby setting the semiconductor wafer at the required position. Examples of means for detecting the positions of the straight-line areas used in the conventional automatic accurate alignment systems include (a) means utilizing laser beams, and (b) means utilizing pattern matching.

According to the means (a), laser beams are irradiated on the surface of the semiconductor wafer, and based on the difference in the state of reflection between the straight-line areas and the rectangular areas having a circuit pattern applied thereto, the positions of the straight-line areas are detected. In ordinary semiconductor wafers, the laser beams are reflected to the same path as the incident ones in the straight-line areas, whereas the laser beams are scattered on the rectangular areas because of the circuit pattern applied thereto. The means (b), on the other hand, involves memorizing a predetermined pattern (generally called a template pattern) characteristic of the surface of a semiconductor wafer and the relative position of the pattern with respect to the straight-line areas, and detecting the same oattern as the aforesaid predetermined pattern on the surface of the semiconductor wafer to be aligned.

The means (a), however, has the following defect or problem. Recent semiconductors include those which are dry-etched at their surfaces, or have a special test pattern or the like applied also to the aforesaid straight-line areas. In such semiconductor wafers, laser beams are scattered on the straight-line areas, and therefore, it is extremely difficult, or impossible, to detect the positions of the straight-line areas.

The means (b), on the other hand, has the following defect or problem. The predetermined pattern and patterns on the surface of the semiconductor wafer are processed as binary digital signals. However, with a semiconductor wafer whose surface has been dry-etched, it is difficult to obtain a stable binary digitized pattern. If some change occurs in the illuminating conditions, etc., the detected binary digitized pattern varies, and detection of the positions of the straight-line areas is likely to become impossible or extremely difficult. Furthermore, unless the semiconductor wafer is fed with a considerable accuracy to the holding means, a fairly long period of time is required for detecting the positions of the straight-line areas.

SUMMARY OF THE INVENTION

It is a primary object of this invention to provide a novel and excellent automatic accurate alignment system suitable, although not exclusively, for automatic accurate alignment of a semiconductor wafer having a given pattern applied to its surface, which at least partly eliminates or solves the defect or problem of a conventional automatic accurate alignment system, especially means therein for detecting the positions of straight-line areas.

Another object of this invention is to provide a novel and excellent automatic accurate alignment system which can detect surely the positions of straight-line areas on the surface of a semiconductor wafer even when the wafer has a dry-etched surface.

Still another object of this invention is to provide a novel and excellent automatic accurate alignment system which can surely detect the positions of straight-line areas on the surface of a semiconductor wafer even when the wafer has a special test pattern or the like applied to its straight-line areas on the surface.

Yet another object of this invention is to provide a novel and excellent automatic accurate alignment system which can fully surely detect the positions of straight-line areas present on the surface of an object to be processed such as a semiconductor wafer even when some change has occurred in the illuminating conditions, etc.

A further object of this invention is to provide a novel and excellent automatic accurate alignment system which can relatively rapidly detect the positions of straight-line areas present on the surface of an object to be processed such as a semiconductor wafer.

An additional object of this invention is to provide a novel and excellent automatic accurate alignment system which can align an object to be processed such as a semiconductor wafer at a required position more accurately and surely than conventional automatic accurate alignment systems.

According to this invention, there is provided an automatic accurate alignment system for positioning at a required position an object to be worked which has on its surface straight-line areas whose image density changes relatively abruptly at their both side edges, said system comprising holding means for holding the object to be worked,
moving means for moving the holding means,
camera means for taking at least a part of the image of the surface of the object held on the holding means and outputting analog signals showing the densities of x-y matrix arrayed pixels, A/D converter means for converting the analog signals output by the camera means into multi-value digital signals, operation means for performing a mathematical operation on the multi-value digital signals to produce binary digital signals, detecting means for detecting the position of at least one side edge of each straight-line area, and thus the position of the straight-line area, on the basis of the binary digital signals, and movement control means for actuating the moving means according to the detected position of the straight-line area and thus positioning the object held on the holding means at the required position.

The various advantages achieved by this invention will become apparent from the following description.

BRIEF DESCRIPTION OF THE DRAWINGS

FIGS. 5-A and 5-B are simplified views which show the visual display by display means of typical examples of digital signals before and after the mathematical operation performed in mode A;

FIGS. 6-A, 6-B and 6-C are diagrams graphically showing typical examples of digital signals before, during and after the mathematical operation performed in mode A in FIG. 4;

FIGS. 7-A and 7-B are simplified views which show the visual display by display means of typical examples of digital signals before and after the mathematical operation performed in mode B in FIG. 4;

FIGS. 8-A and 8-B are diagrams graphically showing typical examples of digital signals before and after the mathematical operation performed in mode B in FIG. 4;

FIGS. 9-A and 9-B are simplified views which show the visual display by display means of typical examples of digital signals before and after the mathematical operation performed in mode C in FIG. 4;

FIGS. 10-A, 10-B and 10-C are diagrams graphically showing typical examples of digital signals before, during and after the mathematical operation performed in mode C in FIG. 4;

DETAILED DESCRIPTION OF PREFERRED EMBODIMENTS

Now, referring to the accompanying drawings, one embodiment of the automatic accurate alignment system constructed in accordance with this invention will be described in detail.

Figure 1:
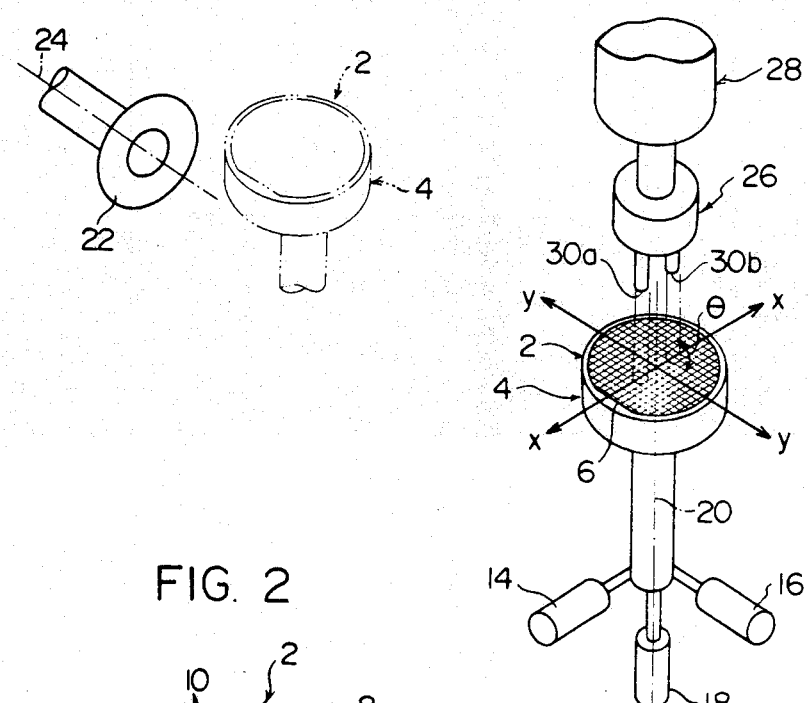
FIG. 1 is a simplified perspective view schematically showing a part of a semiconductor wafer cutting apparatus equipped with one embodiment of the automatic accurate alignment system constructed in accordance with this invention.
Figure 2:
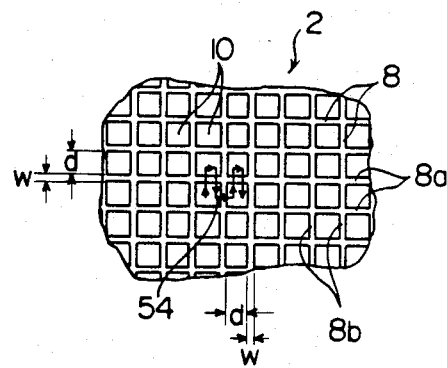
FIG. 2 is a partial top plan view showing a part of the surface of a typical semiconductor wafer.

FIG. 1 schematically shows a part of a semiconductor wafer cutting apparatus equipped with one embodiment of the automatic accurate alignment system constructed in accordance with this invention. A semiconductor wafer 2 to be cut is supplied by a suitable supply means (not shown) of a type known per se and placed on a holding means 4. At this time, the wafer 2 is placed on the holding means 4, not fully accurately but within a certain range of errors, by utilizing an orientation flat 6 present in the wafer 2. In more detail, as shown in FIG. 2, a plurality of straight-line areas 8 arranged in a lattice pattern exist on the surface of the wafer 2. These straight-line areas 8, or known in the art as streets, are arranged at a predetermined distance d from each other with a predetermined width w. The width of a straight-line area 8a extending in a given direction does not have to be always substantially equal to that of a straight-line area 8b extending in a direction perpendicular to the given direction, but the width of any of these streets is generally on the order of several tens of $\mu$m. Furthermore, the distance between the adjoining straight-line areas 8a extending in the given direction need not to be always equal to that between the adjoining straight-line areas 8b extending in a direction perpendicular to the given direction. Thus, in an ordinary wafer 2, a plurality of rectangular areas 10 are defined by the straight-line areas 8 (8a and 8b). A required circuit pattern is applied to these rectangular areas 10. By utilizing the orientation flat 6, the wafer 2 is placed on the holding means 4 such that either the straight-line areas 8a or the straight-line areas 8b (the straight-line areas 8a in the illustrated embodiment) are within an inclination angle range of, for example, about $\pm 1.5$ to $\pm 3.0$ degrees to a predetermined reference direction, i.e., the x-direction (FIG. 1).

Further, with reference to FIG. 1, the holding means 4 which may be of a known type surely holds the wafer 2 onto its surface by vacuum attraction, etc. The holding means 4 is mounted by a suitable supporting mechanism (not shown) so that it can move freely in the x-, y- and $\theta$-directions. A moving means 12 is drivingly connected to the holding means 4 to move it fully precisely in a required manner. In the illustrated embodiment, the moving means 12 is comprised of an x-direction moving source 14, a y-direction moving source 16 and a $\theta$-direction moving source 18. The x-direction moving source 14 conveniently constructed of a pulse motor, when actuated, moves the holding means 4 a predetermined distance in the x-direction with an accuracy of, for example, about 1 $\mu$m. The y-direction moving means conveniently constructed of a pulse motor, when actuated, moves the holding means a predetermined distance in the y-direction, i.e. a direction perpendicular to the x-direction, with an accuracy of, for example, about 1 $\mu$m. The $\theta$-direction moving source 18 which is likewise constructed conveniently of a pulse motor moves the holding means 4 by a given angle, namely rotates the holding means 4 about its central axis 20, with an accuracy of, for example, 0.0015° when it is actuated.

A rotating blade 22 preferably formed of bonded diamond abrasive is provided in the illustrated semiconductor wafer cutting apparatus. The rotating blade 22 constituting wafer cutting means is mounted such that it can freely rotate about the central axis 24 which is substantially parallel to the y-direction, and can freely move in the x-direction. It is rotated at a predetermined speed by a suitable drive source (not shown) such as an AC motor, and is reciprocated in the x-direction at a predetermined speed by a suitable drive source (not shown) such as a DC motor.

In the illustrated semiconductor wafer cutting apparatus, the wafer 2 is placed on the holding means 4 by the supply means (not shown) while the holding means 4 exists in a supply and discharge zone which correspond to the position shown by a solid line in FIG. 1 or its vicinity. Then, as will be stated in detail hereinafter, the position of the holding means 4 is finely adjusted so that the wafer 2 held on the holding means 4 is aligned fully accurately at a predetermined position with respect to the rotating blade 22. Then, the holding means 4 is advanced a predetermined distance in the y-direction to position the holding means 4 and the wafer 2 held on its upper surface at a cutting start zone adjacent to the rotating blade 22 as shown by chain lines in FIG. 1. Thereafter, while the rotating blade 22 is rotated, a cutting movement in the x-direction by which the wafer 2 is put in condition for undergoing the action of the blade 22 being rotated, and a so-called index movement by which the holding means 4 is moved in the y-direction by an amount corresponding to the distance $d+w$ (FIG. 2) between the adjoining straight-line areas 8 existing on the surface of the wafer 2 are alternately effected. As a result, the wafer 2 is cut along the straight-line areas 8b (or 8a) existing on its surface. Subsequently, the holding means 4 is moved by an angle of 90 degrees in the $\theta$-direction about the central axis 20, and then the cutting movement and the index movement are performed alternately to cut the wafer 2 along the straight-line areas 8a (or 8b) existing on its surface. The holding means 4 is then moved backward a predetermined distance in the y-direction and returned to the supply and discharge zone. The cut wafer 2 is discharged from the holding means 4 by a suitable discharge means (not shown) which may be of any type known per se, and the next wafer 2 is placed on the holding means 4 by the supply means (not shown). As is well known to those skilled in the art, the cutting of the wafer 2 by the rotating blade 22 is performed not over the entire thickness of the wafer 2 but in such a manner as to leave a very small non-cut thickness, whereby the rectangular areas 10 (FIG. 2) can be prevented from being completely separated from each other (in which case subsequent application of some force breaks the remaining non-cut portion to separate the rectangular areas 10 completely and form chips). Alternatively, an adhesive tape may be applied in advance to the back surface of the wafer 2 so that even when the wafer 2 is cut over its entire thickness, the rectangular areas 10 will not be separated from each other (in which case subsequent peeling of the adhesive tape results in complete separation of the rectangular areas and formation of chips).

Further, with reference to FIG. 1, the illustrated embodiment includes a stationary magnifying optical means 26 located above the holding means 4 and the wafer 2 held on its surface when the holding means 4 exists in the supply and discharge zone, and a camera means 28 optically connected to the magnifying optical means 26. The magnifying optical means 26 illustrated in the drawing is constructed of a binocular microscope having two light-incoming openings 30a and 30b spaced from each other a suitable distance of, for example, about 40 mm in the x-direction. Hence, the images of two portions of the surface of the wafer 2 on the holding means 4 which are spaced from each other in the x-direction by a predetermined distance are input into the magnifying optical means 26 through the openings 30a and 30b, magnified at a predetermined ratio and sent to the camera means 28 as split images. The magnification ratio achieved by the magnifying optical means 26 may be about 20, for example. If desired, a variable magnification optical means may be used which can vary the magnification stepwise or continuously. The camera means 28 may be of any type which can output an analog signal showing the density of x-y matrix arranged pixels according to the images taken. Preferably, it is constructed of a solid-state camera, particularly a solid camera having a plurality of CCD (charge-coupled devices) arranged in an x-y matrix. In the illustrated embodiment, the camera means 28 is constructed of a solid-state camera having 256×256 CCDs arrayed in a matrix. The image which has entered the left opening 30a of the magnifying optical means 26 is input into the 128×256 CCDs located on the left half portion of the 256×256 CCDs, and the image which has entered the 5 right opening 30b is input into the remaining 128×256 CCDs located in the right half portion. Each of the 256×256 CCDs produces an analog signal having a voltage corresponding to the gray level of a pixel input thereinto. Conveniently, an automatic gain adjusting means (not shown) known per se and capable of automatically adjusting the gain of an output analog signal according to the actual density of the image taken by the camera means is built in, or attached to, the solidstate camera having 256×256 CCDs.

Figure 3:
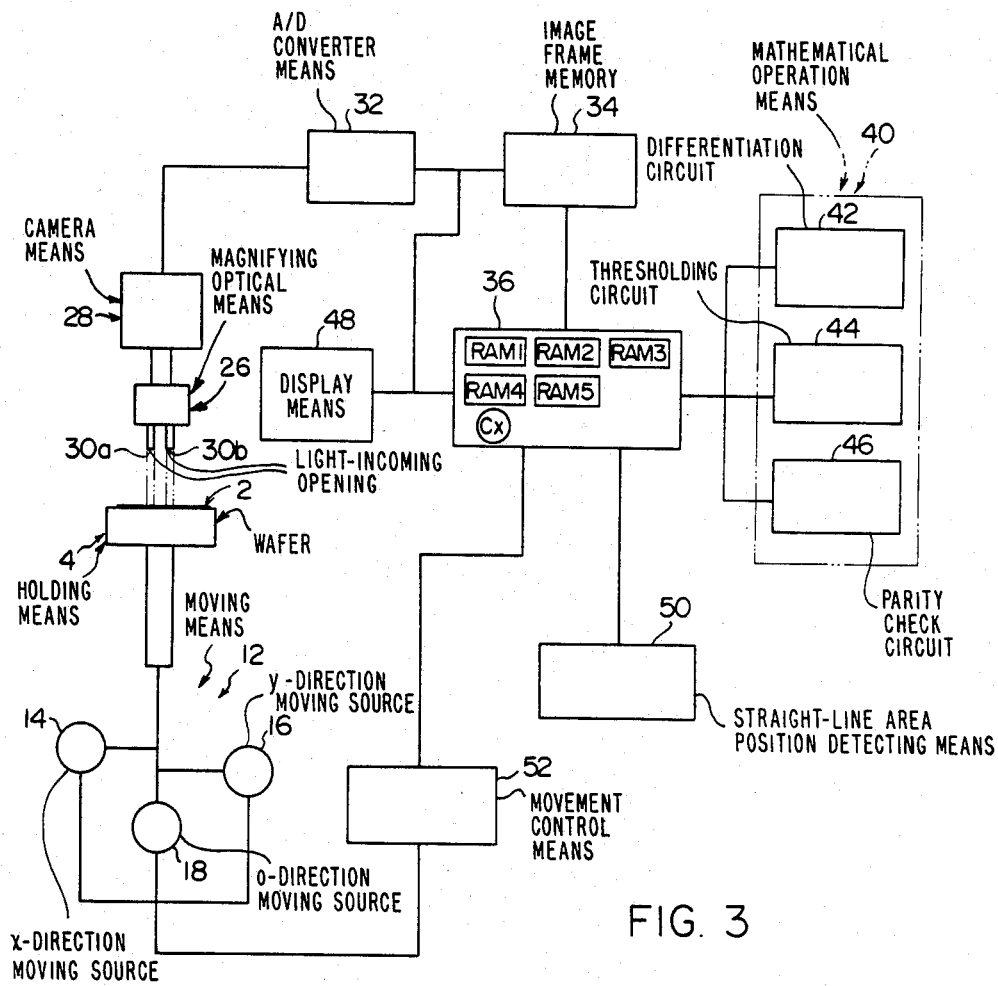
FIG. 3 is a block diagram showing one embodiment of the automatic accurate alignment system constructed in accordance with this invention.

With reference to FIG. 3 which is a block diagram showing various electronic or electrical means provided in relation to the camera means 28, output analog signals of the camera means 28 are input into an A/D (analog/digital) converter means 32 which convert the input analog signals into multi-value digital signals which may, for example, be 8-bit digital signals (therefore, $2^8=256$ levels). The mutli-value digital signals are fed to an image frame memory 34 and memorized there. The image frame memory 34 in the illustrated embodiment is comprised of RAM which has a storage capacity of at least 256×256×8 bits and therefore can memorize 256×256 eight-bit digital signals corresponding respectively to the densities of 256×256 pixels input into 256×256 CCDs in the solid-state camera constituting the camera means 28.

The multi-value digital signals memorized in the image frame memory 34 are processed by a mathematical operation means shown generally at 40 and controlled by a central processing unit (CPU) 36 and thus converted into binary digital signals. The mathematical operation means 40 in the illustrated embodiments includes a differentiation circuit 42, a thresholding circuit 44 and a parity check circuit 46. According to the selection of an operator, a mathematical operation is performed on the multi-value digital signals in the image frame memory 34 in one of modes A, B and C to be described hereinbelow.

Figure 4:
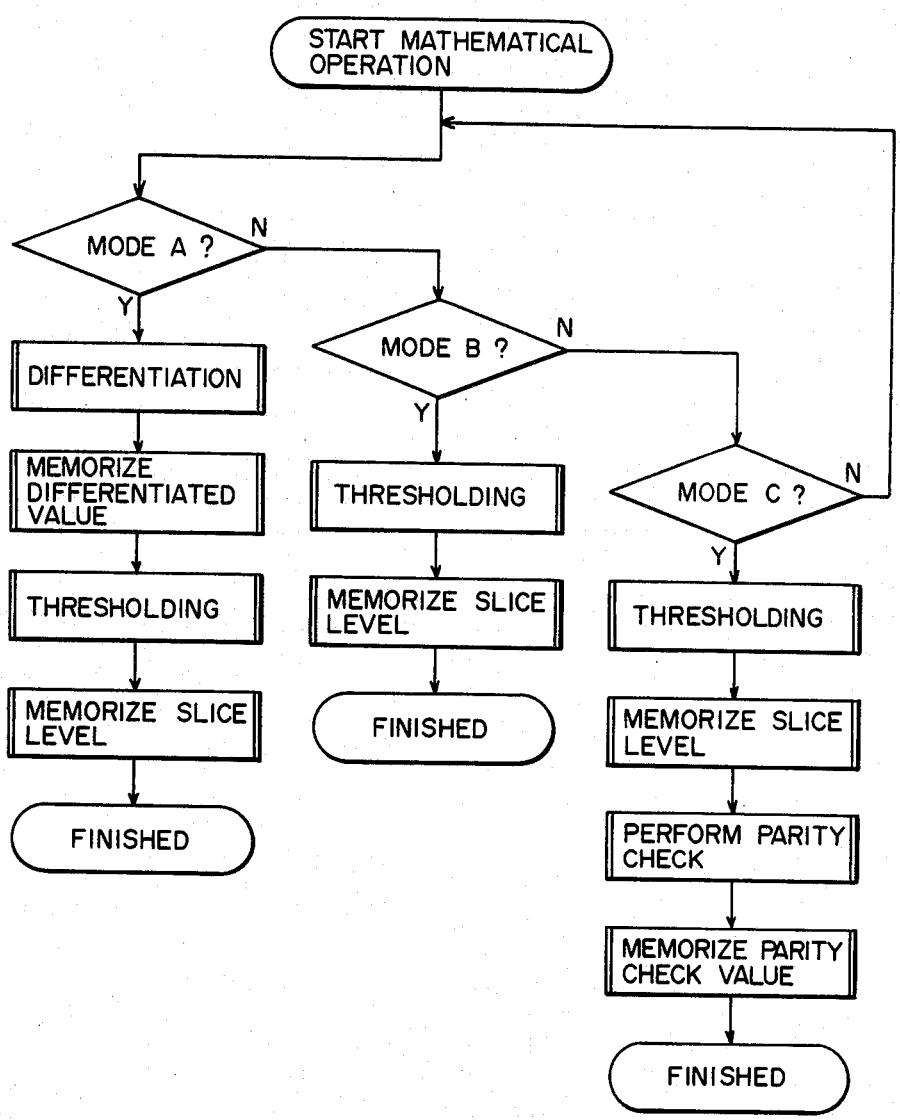
FIG. 4 is a flow chart showing the procedure of a mathematical operation performed by the automatic accurate alignment system of FIG. 3.

With reference to FIG. 4, which is a flow chart for a mathematical operation, taken in conjunction with FIG. 3, the mathematical operation will be described. When mode A is selected, the multi-value digital signals memorized in the image frame memory 34 are first differentiated by the differentiation circuit 42 in order to emphasize changes in the densities of the images taken by the camera means. The differentiation can be performed by any of various differentiation methods capable of emphasizing changes in density in the x-direction and/or y-direction, or in order directions, for example a differentiation method using any one of the various first-order differentiation operators, i.e. so-called differentiation masks described at pages 46–48 of "Theory of Image Recognition" (Japanese-language publication), by Makoto Nagao, in Information Engineering Lecture 16, published by Corona Sha. As one example of a differentiating procedure which is relatively simple and therefore can be performed at fully high speeds and can fully achieve the desired object, there can be cited a differentiation procedure by which a change in density in either one of the x-direction and the y-direction (the y-direction in the illustrated embodiment) is emphasized. In this differentiation procedure, the following typical differentiation mask can be used.

| −1 | −1 | −1 |
| --- | --- | --- |
| 0 | 0 | 0 |
| 1 | 1 | 1 |

According to the differentiation procedure using this differentiation mask, when the values of the multivalue digital signals memorized in the image frame memory 34 are as shown below

| | X | | |
| --- | --- | --- | --- |
| Y | m − 1 | m | m + 1 |
| n − 1 | A | B | C |
| n | D | E | F |
| n + 1 | G | H | I |

$f(m,n) = |-A-B-C+G+H+I|$ is calculated as a differentiated value $f(m,n)$ at address $(x=m, y=n)$. Thus, the 256×256 multi-value digital signals stored in the image frame memory 34 are converted to 254×254 differentiated values $f(m,n)$. The 254×254 differentiated values so calculated are, for example, 8-bit multi-value digital signals. These differentiated multi-value digital signals are memorized by accumulating them in the image frame memory 34 in place of the multi-value digital signals stored in the image frame memory 34. If desired, a memory having a memory capacity of at least 254×254 ×8 bits may be provided independently of the image frame memory 34, and the differentiated multi-value digital signals may be memorized in this different memory.

Then, the thresholding circuit 46 thresholds the differentiated multi-value digital signals memorized in the image frame memory 34 with a predetermined slice level to form binary digital signals. The binary digital signals so formed are memorized together with their addresses in the x-direction and the y-direction in RAM1 built in the central processing unit 36. The slice level at the time of threshold can be preset by the operator. Or it is possible to detect the maximum of the 254×254 differentiated values so that the maximum of these may be extracted, and automatically set a slice level ranging from a value slightly smaller than the maximum value to a value slightly larger than the maximum value. In this case, if the slice center level is too large, straight lines cannot be detected in the operation of detecting straight-line areas to be described hereinafter. If, on the other hand, the slice center level is too small, many pseudo straight lines are detected in the operation of detecting straight-line areas to be described hereinafter. Accordingly, by changing the slice level little by little, the optimum slice level can be automatically selected (self-learning of the system). Once the optimum slice level has been selected, it does not need to be varied unless the wafer 2 (FIG. 1) to be aligned is changed to another type.

In the illustrated embodiment, there is also provided a display means 48 for visually displaying selectively an image corresponding to either a multi-value digital signal output by the A/D converter means 32 or a binary digital signal memorized in RAM1, RAM2 or RAM3 (RAM2 and RAM3 will be described hereinafter) built in the central processing unit 36. Conveniently, the display means 48 is comprised of a cathode ray tube (CRT). The illustrated display means 48 displays at its left half portion an image corresponding to the image input into the camera means 28 from the left side opening 30a of the magnifying optical means 26 and at its right half portion an image corresponding to the image input into the camera means 28 from the right side opening 30b of the magnifying optical means 26, each in a total magnification of about 260 times.

For better understanding, the above mathematical operation in mode A will be described below in relation to the images displayed on the display means 48. As a typical example, let us consider the case wherein an image displayed on the screen of the display means 48 as an image corresponding to the multi-value digital signal output by the A/D converter means 32 (hence, an image to be taken by the camera means 28) contains a straight-line area 8a located nearly centrally in the y-direction, and the density of the image is relatively low in the straight-line area 8a and is relatively high in the parts above and below the straight-line area 8a, i.e. the rectangular areas 10 having a given circuit pattern applied thereto, because of the pattern applied, as shown in FIG. 5-A (in FIG. 5-A, cross hatchings are used to show a high image density). In this case, the multi-value digital signals output by the A/D converter means 32 which are along the line m-m of FIG. 5-A, i.e. along addresses in which the address in the x-direction is x=m and remains unchanged and the address in the y-direction varies from y=1 to y=256, are as graphically displayed in FIG. 6-A. When these multi-value digital signals are differentiated in order to emphasize changes in density in the y-direction, the multi-value digital data shown in FIG. 6-A are converted to differentiated multi-value digital signals graphically displayed in FIG. 6-B. Such differentiated multi-value digital signals are relatively large in both side edges of the straight-line area 8a, i.e. the upper side edge E1 and the lower side edge E2, where the change of the density in the y-direction is abrupt, and are relatively small in the other parts where the change of the density in the y-direction is relatively slow or substantially absent. When the differentiated multi-value digital signals shown in FIG. 6-B are then thresholded with a predetermined slice level sw to produce binary digital signals, they become "1" in the upper side edge E1 and the lower side edge E2 of the straight-line area 8a, and "0" in the other parts, as graphically displayed in FIG. 6-C. When the binary digital signals obtained by thresholding with the predetermined slice level sw, i.e. signals memorized in RAM1 built in the central processing unit 36, are sent to the display means 48 and visually displayed, there appears an image which has a low image density, and therefore a high brightness, only at the upper side edge E1 and the lower side edge E2 of the straight-line area 8a and a high image density, and therefore a low brightness, at the other parts, as shown in FIG. 5-B (in FIG. 5-B, too, cross hatchings are used to show a high image density).

In the mathematical ooeration in mode A described hereinabove, differentiation is performed to emphasize a change in the density of an image taken by the camera means, and by thresholding the differentiated multi-value digital signals, binary digital signals are produced which clearly show the upper side edge E1 and the lower side edge E2 of the straight-line area 8a. It will be readily seen therefore that even when the conditions for illuminating the surface of the wafer 2 (FIG. 1) held on the holding means 4 or the reflectance of the surface of the wafer 2 slightly changes and the absolute value of the density of the input image changes, binary digital signals can be surely produced which clearly show the upper side edge E1 and the lower side edge E2 of the straight-line area 8a. As another noteworthy point, when a special test pattern is applied to the straight-line area 8a or when straight lines or straight-line areas which abruptly change in density exist in the circuit pattern applied to the rectangular area 10, the aforesaid binary digital signals clearly show not only the upper side edge E1 and the lower side edge E2 but also pseudo straight lines. It has been confirmed by the experiments of the present inventors, however, that when an operation of detecting the position of a straight-line area is performed in the manner to be described below subsequent to the mathematical operation in mode A, it is possible to detect the upper side edge E1 and the lower side edge E2 of the straight-line area 8a, therefore the position of the straight-line area 8a, surely and easily even in the above case with wafers in which the image density changes relatively abruptly in both side edges E1 and E2 of the straight-line area 8a, therefore with most of the wafers now in existence.

When mode B is selected, it will be understood from the flow chart shown in FIG. 4 that the 256×256 multi-value digital signals input into the image frame memory 34 from the A/D converter means 32 and memorized in the memory 34 are directly thresholded with a predetermined slice level by the thresholding circuit 46, and as a result, 256×256 binary digital signals are produced. The binary digital signals are memorized together with their addresses in the x-direction and y-direction in RAM2 built in the central processing unit 36. The slice level at the time of thresholding can be pre-set by the operator. Or the optimum slice level can be automatically selected also by the self-leaning of the system.

In relation to an image displayed on the display means 48, the mathematical operation in mode B is described below. The mathematical operation in mode B which is performed more rapidly and in a much simpler manner than the operation in mode A is especially effective when an image displayed on the screen of the display means 48 as an image corresponding to the multi-value digital signal output by the A/D converter means 32 (therefore, an image to be taken by camera means 28) has a relatively high (or low) density only at both side edges, i.e. the upper side edge E1 and the lower side edge E2, of the straight-line area 8a, and a relatively low (or high) density at the other parts, i.e. the central portion of the straight-line area 8a and the rectangular areas 10 existing above and below the straight-line area 8a, as shown in FIG. 7-A (in FIG. 7-A, cross hatchings are used to show a high image density). In the case of the image shown in FIG. 7-A, the multi-value digital signals output by the A/D converter means 32 which are along the line m-m in FIG. 7-A, i.e. along addresses in which the address in the x-direction is x=m and does not vary but the address in the y-direction varies from y=1 to y=256, are as graphically shown in FIG. 8-A. When such multi-value digital signals are directly thresholded with a predetermined slice level sw, they become "1" only at the upper side edge E1 and the lower side edge E2 of the straight-line area 8a, and "0" at the other parts. When the binary digital signals obtained by thresholding with the predetermined slice level sw, i.e. the signals memorized in RAM1 built in the central processing unit 36, are sent to the display means 48 and visually displayed, there appears an image which, as shown in FIG. 7-B, has a low density, and therefore a high brightness, only at the upper side edge E1 and the lower side edge E2 of the straight-line area 8a, and a high image density, and therefore a low brightness, at the other parts (in FIG. 7-B, cross hatchings are applied to show a high image density).

The mathematical operation in mode B described above has the advantage of being much simpler and more rapid than the mathematical operation in mode A described earlier. Experiments of the present inventors, however, have shown that the operation in mode B is effective for a specific type of wafers in which as shown in FIG. 7-A, the image density at the upper side edge E1 and the lower side edge E2 of the straight-line area 8a differ comparatively markedly from that at the other parts, but when it is applied to other various types of wafers, it is impossible or considerably difficult to detect the positions of the upper side edge E1 and the lower side edge E2 of the straight-line area 8a, and therefore the position of the straight-line area 8a. Furthermore, as will be readily seen, when the conditions for illuminating the surface of the wafer 2 (FIG. 1) held on the holding means 4 or the reflectance of the surface of the wafer 2 changes to a comparatively great extent and the absolute value of the density of the image taken by the camera means changes, it tends to become impossible or considerably difficult according to mode B to detect the position of the straight-line area 8a.

The operation according to mode C will now be described. In this mode, as shown in the flow chart of FIG. 4, the 256×256 multi-value digital signals input into the image frame memory 34 from the A/D converter means 32 and memorized in the memory 34 are first thresholded with a predetermined slice level by the thresholding circuit 46 to produce 256×256 intermediate binary digital signals. The 256×256 intermediate binary digital signals are memorized together with addresses in the x-direction and y-direction in RAM3 built in the central processing unit 36. The slice level during the thresholding can be preset by the operator as in modes A and B, or the optimum slice level can be automatically selected by the self-learning of the system. In mode C, the parity check circuit 46 performs parity check on the intermediate binary digital signals memorized in RAM3 so as to extract parts at which the intermediate binary digital signals change from "1" to "0" or from "0" to "1". When the intermediate binary digital signals memorized in RAM3 have the following numerical values

| Y | X | |
|---|---|---|
| | m | m + 1 |
| n | A | B |

-continued

| Y | X | |
|---|---|---|
|   | m | m + 1 |
| n + 1 | C | | the parity check calculates "0" only when A=B=C and "1" in other cases as a parity check value P(m,n) at address (x=m, y=n). Thus, the 256×256 intermediate binary digital signals memorized in RAM3 are converted to 255×255 binary digital signals by the parity check. The 255×255 binary digital signals obtained by the parity check are memorized by accumulating them in RAM3 in place of the binary digital signals before the parity check memorized in RAM3. If desired, separate RAMs may be used, instead of one common RAM3, to store the binary digital signals before and after the parity check.

The mathematical operation in mode C will be described in relation to the image displayed on the display means 48. The mathematical operation in mode C is based on so-called boundary extraction, and is especially effective when an image displayed on the screen of the display means 48 as an image corresponding to the multi-value digital signal output by the A/D converter means 32 (hence, the image to be taken by the camera means 28) has a sufficiently uniform image density throughout the straight-line area 8a and shows a comparatively marked difference in image density between the straight-line area 8a and the rectangular areas 10 exsisting above and below it, as illustrated in FIG. 9-A. In the image shown in FIG. 9-A, the straight-line area 8a has a sufficiently uniform relatively low image density throughout and the rectangular area 10 has a relatively high image density (in FIG. 9-A, cross hatchings are used to show a high image density). In the case of the image shown in FIG. 9-A, the multi-value digital signals output by the A/D converter means 32 which are along the line m-m of FIG. 9-A, i.e. along addresses in which the address in the x-direction is x=m and does not vary but the address in the y-direction varies from y=1 to y=256, are as graphically displayed in FIG. 10-A. When these multi-value digital signals are converted to the intermediate binary digital signals by thresholding with the predetermined slice level sw, they become "1" in the straight-line area 8a and "0" in the rectangular area 10, as graphically shown in FIG. 10-B. When the intermediate binary digital signals are then subjected to parity check as stated above, they become "1" only at the upper side edge E1 and the lower side edge E2 of the straight-line area 8a and "0" at the other parts as graphically shown in FIG. 10-C. When the binary digital signals obtained by the parity check and memorized in RAM3 built in the central processing unit 36 are fed to the display means 48 and visually displayed, there appears an image which has a low image density, and therefore a high brightness, only at the upper side edge E1 and the lower side edge E2, and a high image density, and therefore a low brightness, at the other parts as shown in FIG. 9-B (in FIG. 9-B, cross hatchings are used to show a high image density).

Experiments by the present inventors have shown that for wafers in which no special test pattern is applied to straight-line areas 8a and the straight-line areas 8a have a sufficiently uniform image density throughout, selection of mode C generally permits simpler and more rapid detection of the positions of the upper side edge E1 and the lower side edge E2, and therefore the position of the straight-line area 8a, in the operation of detecting the position of a straight-line area to be described hereinafter than does selection of mode A. However, when mode C is selected for wafers in which a special test pattern is applied to straight-line areas 8a, selection of mode C makes it impossible or considerably difficult to detect the position of the straight-line area 8a. Furthermore, it will be readily understood that when mode C is selected, the detection of the position of the straight-line area 8a tends to become impossible or considerably difficult when the conditions for illuminating the surface of the wafer 2 (FIG. 1) held on the holding means 4 change relatively greatly and the absolute value of the density of the image taken by camera means changes.

In the illustrated embodiment, after the mathematical operation in mode A, B or C, the straight-line area position detecting means 50 (FIG. 3) controlled by the central processing unit 36 detects at least one side edge E1 or E2 of the straight-line area 8a on the basis of the binary digital signals memorized in RAM1, RAM2 or RAM3 included in the central processing unit 36, and thus determines the position of the straight-line area 8a.

Figure 11:
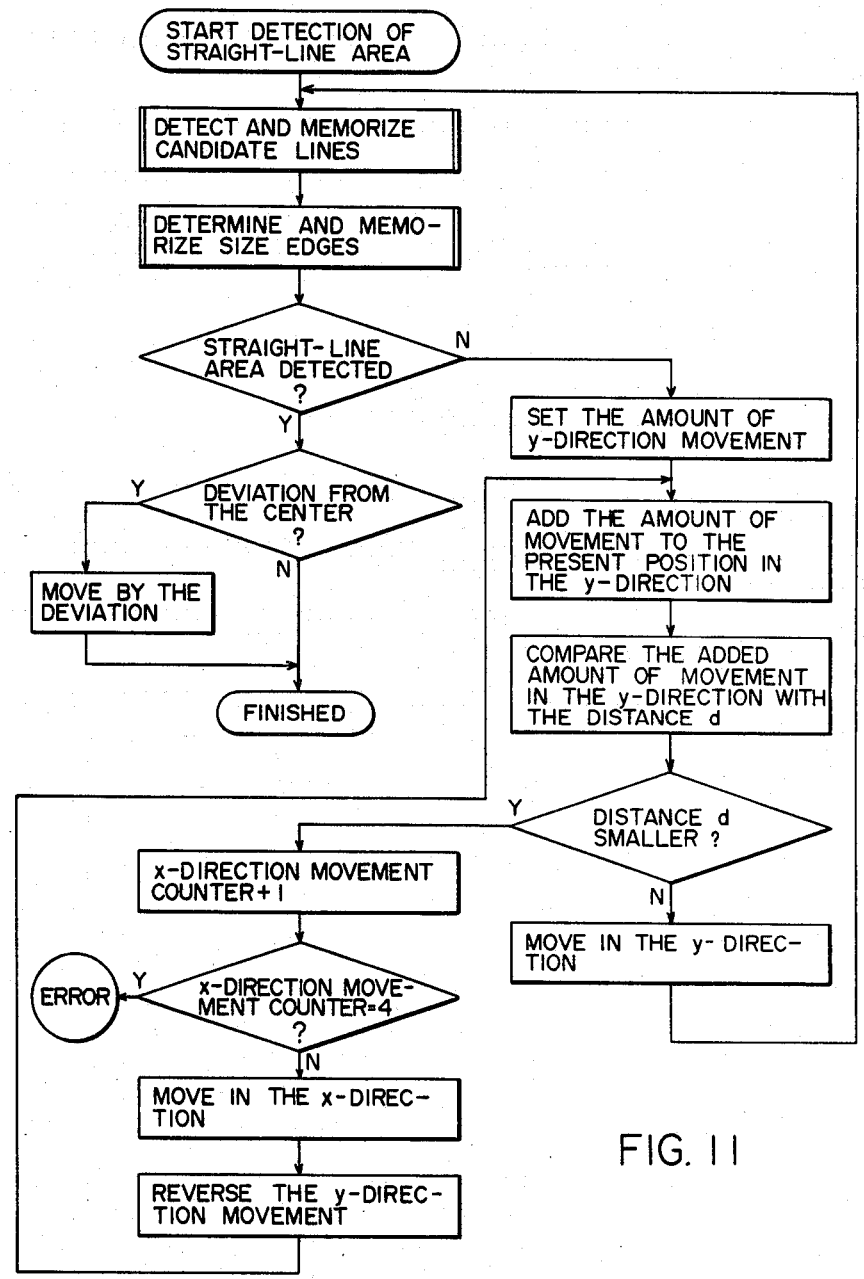
FIG. 11 is a flow chart showing the procedure of detecting the position of a straight-line area which is performed by the automatic accurate alignment system of FIG. 3.

In the illustrated embodiment, the images of the two portions of the surface of the wafer 2 which are spaced from each other by a predetermined distance in the x-direction are taken by the camera means 28. Detection of the position of a straight-line area is carried out on each of the images of the two portions. With reference to FIG. 11 which is a flow chart for detecting the position of a straight-line area in conjunction with FIG. 3, the detection of the position of a straight-line area in each image by the detecting means 50 will be described. In the binary digital signals memorized in RAM1, RAM2 or RAM3 in the central processing unit as a result of the mathematical operation in mode A, mode B or mode C described above, signal "ones" corresponding to the upper side edge E1 and the lower side edge E2 of the straight-line area 8a exist continuously in a predetermined direction. Based on this fact, the detecting means 50 first scans the binary digital signals stored in RAM1, RAM2 or RAM3 built in the central processing unit 36 to examine whether a predetermined number or more of signal "ones" exist continuously in a predetermined direction, thus detects candidate lines of the upper side edge E1 and/or the lower side edge E2 of the straight-line area 8a, i.e. the position at which a predetermined number or more of signal "ones" exist continuously, and memorizes the positions of the candidate lines in RAM4 built in the central processing unit 36. In the illustrated embodiment, there is a possibility that the straight-line areas 8a existing on the surface of the wafer 2 held on the holding means 4 are inclined at an inclination angle range of, for example, about ±1.5 to ±3.0 degrees with respect to the x-direction (FIG. 1). Accordingly, the above examination of whether signal "ones" exist continuously in a predetermined number is carried out not only by scanning the binary digital signals in the x-direction or more specifically by increasing the address in the x-direction for each address in the y-direction, but also in a region inclined by an angle range of, for example, about ±1.5 to ±3.0 degrees with respect to the x-direction. This inclination examination can be achieved by performing so-called approximate θ scan by which a plurality of addresses in the x-direction are increased for each increment of the address in the y-direction. In the illustrated embodiment, for example, the approximate θ scan by which $$\frac{1}{\tan 0.5°} \approx 115$$

addresses are increased in the x-direction every time one address is increased in the y-direction is a scan having an inclination angle of about 0.5 degree to the x-direction, and the approximate θ scan is carried out by changing the inclination angle for each 0.5 degree or so to the x-direction within the allowable inclination angle range of, for example, ±1.5 to ±3.0 degrees. The predetermined number of signal "ones" continuously present can be properly preset by the operator. It may, for example, be about 80 when there are 128 pixels in the x-direction of each image, as in the illustrated embodiment.

Frequently, straight-line areas exist in a circuit pattern applied to the rectangular areas 10 (FIG. 2) on the surface of the wafer 2 or a special test pattern applied to the straight-line areas 8a (or 8b) of the wafer 2. Hence, candidate lines detected as described above frequently contain not only the upper side edge E1 and the lower side edge E2 of the straight-line area 8a but also the edges of the straight-line areas of the aforesaid circuit pattern or test pattern. Hence, the detecting means 50 then determines whether each detected candidate line is actually the upper side edge E1 or the lower side edge E2 of the straight-line area 8a. If it can so determine, the position of the upper side edge E1 or the lower side edge E2 is memorized in RAM5 built in the central processing unit 36.

Whether a detected candidate line is actually the upper side edge E1 or the lower side edge E2 of the straight-line area 8a can be determined in the following manner. If the detected candidate line is actually the upper side edge E1 or the lower side edge E2 of the straight-line area 8a, there naturally exists the lower side edge E2 or the upper side edge E1 of a straight-line area 8a which extends parallel to the detected candidate line and is spaced therefrom in the y-direction by a distance corresponding to the width w (FIG. 2) of the straight-line area 8a, and therefore, another detected candidate line corresponding to it exists. Based on this fact, the detecting means 50 detects the presence or absence of another candidate line extending substantially parallel and spaced by a distance corresponding to the width w of the straight-line area 8a in the y-direction, with respect to each of the candidate lines memorized in RAM4. Thus, the detecting means 50 determines whether each of such candidate lines is actually the upper side edge E1 or the lower side edge E2 of the straight-line area 8a. When in the above manner the position of the upper side edge E1 and/or the lower side edge E2 of the straight-line area 8a, and therefore the position of the straight-line area 8a, have been detected and determined, the central processing unit 36 checks whether there is a deviation between the center in the y-direction of the image taken by the camera means (which is the optical center in the y-direction of the optical magnifying means 26 and the center in the y-direction of the display screen of the display means 48) and the center of the straight-line area 8a. When a deviation exists, the movement control means 52 for controlling the x-direction movement source 14, the y-direction movement source 16 and the θ-direction movement source 18 drives the y-direction movement source 16 to move the holding means 4 and the wafer 2 held thereon in the y-direction by an amount corresponding to the aforesaid deviation, and consequently to position the straight-line area 8a at the center in the y-direction of the image taken by the camera means.

On the other hand, when no straight-line area 8a exists, or only a part of a straight-line area 8a in the y-direction exists, in the image of a part of the surface of the wafer taken by the camera means owing to the position of the wafer 2 placed on the holding means 4, or when a straight-line area 8a locally disappears in the image of a part of the surface of the wafer 2 taken by the camera means 28 owing to poor printing, etc., the straight-line area 8a cannot be detected by the aforesaid detection and determination of candidate lines. In such a case, the central processing unit 36 sets the amount of y-direction movement as shown in FIG. 11. This amount of y-direction movement may be a suitable amount smaller than the distance d between the straight-line areas 8a, for example about 300 μm. Then, the amount of y-direction movement is added to the present position in the y-direction of the holding means 4 and the wafer 2 held thereon. In the next place, the amount of y-direction movement added is compared with the distance d. If the distance d is smaller (when the amount of y-direction movement is further added after the y-direction movement has been repeated a plurality of times, the distance d becomes larger), the movement control means 52 drives the y-direction movement source 16 to move the holding means 4 and the wafer 2 held thereon in the y-direction by the amount of y-direction movement. Thereafter, the aforesaid detection of candidate lines and the aforesaid determination of side edges are repeated (needless to say, in this case, the mathematical operation in mode A, B or C is performed prior to the detection of candidate lines). If, however, the distance d becomes smaller than the amount of y-direction movement added as a result of adding the amount of y-direction movement a plurality of times, and therefore, the total amount of y-direction movement exceeds the distance d upon movement of the holding means 4 and the wafer 2 thereon in the y-direction by the aforesaid amount of y-direction movement, one is added to an x-direction movement amount counter Cx (FIG. 3) built in the central processing unit 36 prior to performing the y-direction movement, and then it is determined whether the counted value of the x-direction movement amount counter Cx is 4 or not (in other words, whether the x-direction movement has been repeated three times). When the counted value of the x-direction movement amount counter is not 4, the movement control means 52 drives the x-direction movement source 14 to move the holding means 4 and the wafer 2 held thereon in the x-direction by a predetermined amount which may, for example, be about 170 μm. Thereafter, the y-direction movement is set in a reverse direction (if the previous y-direction movement is in a positive direction, it is then set in a negative direction). Subsequently, the holding means 4 and the wafer 2 held thereon are moved in a reverse direction by the aforesaid amount of y-direction movement, candidate lines are detected and the side edges are determined. It will be understood therefore that in the illustrated embodiment when the straight-line area 8a cannot be detected, the detection of the straight-line area 8a is repeated by moving the holding means 4 and the wafer 2 held thereon in a zigzag fashion in the y- direction and the x-direction (the movement in the x-direction is performed three times at most).

Figure 12:
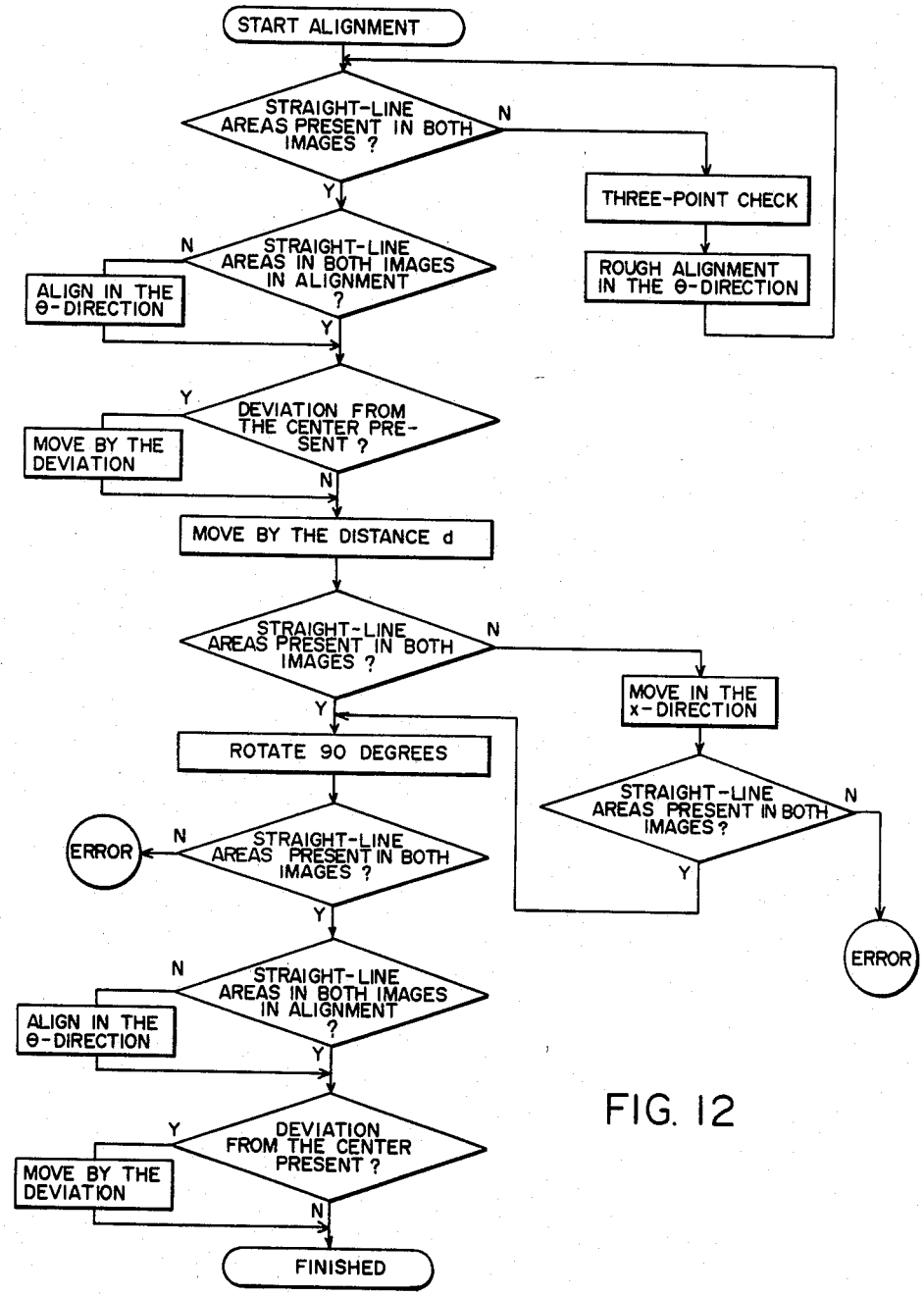
FIG. 12 is a flow chart showing the procedure of accurate alignment performed by the automatic accurate alignment system of FIG. 3.

Now, the procedure of accurate alignment of the wafer 2 on the holding means 4 on the basis of the detection of the straight-line area 8a will be described with reference to FIG. 12 showing the flow chart of accurate alignment taken in conjunction with FIG. 3. According to the accurate alignment procedure in the illustrated embodiment, it is first judged whether a straight-line area 8a exists in both of the images of two parts spaced from each other by a predetermined interval in the x-direction which are taken by the camera means 28. As stated above, a straight-line area 8a is detected for each of the images of the two parts in the operation of detecting the position of a straight-line area. When after the straight-line area 8a has been detected in one of the images, the straight-line area 8a is detected in the other image, the holding means 4 and the wafer 2 held thereon are sometimes moved in the y-direction and/or the x-direction. Accordingly, if the straight-line area 8a is inclined at a relatively large angle to the x-direction, at least a part of the straight-line area 8a in the y-direction might disappears in one of the images. When the line position detecting means 50 cannot detect the straight-line area 8a in either one of the images of the two parts, the inclination angle of the straight-line area 8a detected in the other image to the x-direction is detected. The detection of the inclination angle can be conveniently carried out by moving the holding means 4 and the wafer 2 held thereon in the x-direction by a predetermined distance at least once, and utilizing the difference between the y-direction position of the straight-line area 8a before the movement and that after the movement. In the illustrated embodiment, a three-point checking method is employed, and the inclination angle is detected on the basis of the difference among the y-direction position of the straight-line area 8a in the image before movement, the y-direction position of the straight-line area 8a after the $\theta$-direction driving source 18 is driven to move the holding means 4 and the wafer 2 thereon in the x-direction by a predetermined distance which may, for example, be about 2 mm, and the y-direction position of the straight-line area 8b after the $\theta$-direction drive source 18 has been driven to move the holding means 4 and the wafer 2 thereon further in the x-direction by the aforesaid predetermined amount. When the inclination angle has been detected as above, rough alignment in the $\theta$-direction is carried out according to the inclination angle detected. Specifically, according to the detected inclination angle, the movement control means 52 drives the $\theta$-direction moving source 18 to move the holding means 4 and the wafer 2 thereon in the $\theta$-direction, more specifically rotate them about the central axis 20 (FIG. 1), whereby the straight-line area 8 is kept nearly parallel to the x-direction. It will be readily understood that when this rough alignment in the $\theta$-direction is carried out, a straight-line area 8a exists both in the images of the two parts spaced from each other a predetermined distance in the x-direction which are taken by the camera means 28. When the presence of straight-line areas 8a in both of the images of the two parts is determined, it is judged whether the y-direction position of the straight-line area 8a detected in each of the images of the two parts is aligned or not. It will be easily understood that when the straight-line area 8a is not kept parallel to the x-direction sufficiently accurately, there is a difference between the y-direction positions of the straight-line areas 8a detected in the images of the two parts spaced from each other a predetermined distance in the x-direction. If this difference exists, alignment in the $\theta$-direction must be carried out sufficiently accurately. Specifically, the movement control means 52 drives the $\theta$-direction movement source 18 according to the aforesaid difference to move the holding means 4 and the wafer 2 thereon in the $\theta$-direction, whereby the straight-line area 8a is maintained parallel to the x-direction sufficiently accurately. Then, the central processing unit 36 judges whether or not there is a deviation between the center in the y-direction of the image taken by the camera means (which is the optical center in the y-direction of the optical magnifying means 26 and the center in the y-direction of the display screen of the display means 48) and the center of the straight-line area 8a. When there is a deviation, the movement control means 52 drives the y-direction moving source 16 to move the holding means 4 and the wafer 2 thereon in the y-direction by an amount corresponding to the deviation and thus position the straight-line area 8a sufficiently accurately at the center in the y-direction of the image taken by the camera means. Thereafter, the movement control means 52 drives the y-direction moving source 16 to move the holding means 4 and the wafer 2 thereon in the y-direction by an amount corresponding to the distance d (FIG. 2) between the straight-line areas 8a. Then, again, it is determined whether or not a straight-line area 8a exists in both of the images of the two parts spaced from each other a predetermined distance in the x-direction which are taken by the camera means 28. Since the amount of movement of the holding means 4 and the wafer 2 thereon in the y-direction is the distance d between the straight-line areas 8a, the presence of the straight-line area 8a can usually be determined in both of the images of the two parts. If, however, it cannot be determined because of poor printing or other causes, the movement control means 52 drives the x-direction moving source 14 to move the holding means 4 and the wafer 2 thereon in the x-direction by a predetermined distance which may, for example, be about 200 $\mu$m. Thereafter, it is again determined whether or not the straight-line area 8a exists in both of the images of the two parts. When the presence of the straight-line area 8a in both of the images of the two parts is determined, the movement control means 52 drives the $\theta$-direction moving source 18 to move the holding means 4 and the wafer 2 thereon by an angle of 90 degrees in the $\theta$-direction, namely to rotate them 90 degrees about the central axis 20 (FIG. 1). It will be readily seen that as a result, instead of the straight-line area 8a, the straight-line area 8b crossing it at right angles becomes parallel to the x-direction sufficiently accurately and is positioned at the center of each of the images of the two parts. Then, for the sake of caution, it is determined whether or not the straight-line area 8b exists in both of the images of the two parts and also whether the y-direction positions of the straight-line areas 8b detected in the images of the two parts are aligned. If the straight-line area 8b is not maintained fully accurately parallel to the x-direction and there is a difference between the y-direction positions of the straight-line areas 8b detected in the images of the two parts, the movement control means 52 drives the $\theta$-direction moving source 18 on the basis of this difference to move the holding means 4 and the wafer 2 thereon in the $\theta$-direction, whereby the straight-line area 8b is maintained parallel to the x-direction fully accurately. Thereafter, it is judged whether there is a deviation between the center in the y-direction of the image taken by the camera means (which, therefore, is the optical center in the y-direction of the optical magnifying means 26 and the center in the y-direction of the display screen of the display means 48) and the center of the straight-line area 8b. If there is a deviation, the movement control means 52 drives the y-direction moving source 16 to move the holding means 4 and the wafer 2 thereon in the y-direction by an amount corresponding to the above deviation, and thus position the straight-line area 8b fully accurately at the center in the y-direction of the image taken by the camera means. Thus, the wafer 2 held on the holding means 4 is aligned fully accurately and surely at a predetermined position with respect to the rotating blade (FIG. 1). After the accurate alignment described above is completed, the wafer 2 can be cut as described hereinabove with reference to FIG. 1.

While the present invention has been described in detail hereinabove with reference to the accompanying drawings showing one embodiment of the automatic accurate alignment system, it should be understood that the invention is not limited to this specific embodiment, and various changes and modifications are possible without departing from the scope of this invention.

What is claimed is:

1. An accurate alignment system for positioning at a required position an object to be worked which object has on its surface straight-line areas whose image density changes relatively abruptly at both side edges of said areas, said system comprising
   holding means for holding the object to be worked,
   moving means for moving the holding means,
   camera means for taking at least a part of the image of the surface of the object held on the holding means and outputting analog signals showing the densities of x-y matrix arrayed pixels,
   A/D converter means for converting the analog signals output by the camera means into multi-value digital signals,
   operation means for performing a mathmatical operation on the multi-value digital signals to produce binary digital signals, storage means for storing said binary digital signals,
   detecting means for detecting the position of at least one side edge of each straight-line area, and thus the position of the straight-line area, said detecting means having a means to scan said stored binary digital signals to determine whether at least a predetermined number of binary digital signals "1" exist along one specific predetermined direction running transverse to either an (x) or a (y) reference axis and along a plurality of predetermined directions within a predetermined angular range to said one specific predetermined direction, wherein the detecting means also detects whether the other side edge of the straight-line area exists at a position spaced a predetermined distance from one detected side edge of the straight-line area, and thus determines whether the detected one side edge is actually the one side edge of the straight-line area, said holding means remaining stationary while said detection means is detecting the position of the side edges of said straight line areas,
   and movement control means for actuating the moving means according to the detected position of the straight-line area and thus positioning the object held on the holding means at the required position.

2. The system of claim 1 wherein
   the object to be worked is a semiconductor wafer having on its surface a plurality of straight-line areas with predetermined widths arranged in a lattice pattern at predetermined intervals,
   the moving means includes an x-direction moving source for moving the holding means in the x-direction, a y-direction moving source for moving the holding means in the y-direction and a θ-direction moving source for moving the holding means in the θ-direction,
   a magnifying optical means is disposed between the surface of the semiconductor wafer and the camera means, and the image of at least a part of the surface of the semiconductor wafer is enlarged at a predetermined magnification by the magnifying optical means and input into the camera means, and
   when the detecting means cannot detect the straight-line area, the movement control means actuates either one of the x-direction moving source and the y-direction moving source to move the holding means in either one of the x-direction and the y-direction by a predetermined distance smaller than the distance between the straight-line areas.

3. The system of claim 2 wherein when as a result of repeatedly moving the holding means by the predetermined distance in one of the x-direction and the y-direction, further movement of the holding means in one of the x-direction and the y-direction by said predetermined distance causes the total amount of movement of the holding means in one of the x-direction and the y-direction to exceed the distance between the straight-line areas, the movement control means actuates the other of the x-direction moving source and the y-direction moving source to move the holding means in the other of the x-direction and the y-direction by a predetermined distance.

4. The system of claim 3 wherein the movement control means, after actuating said other of the x-direction moving source and the y-direction moving source, further actuates said one of the x-direction moving source and the y-direction moving source to move the holding means in said one of the x-direction and the y-direction by said predetermined distance.

5. The system of claim 4 wherein the movement of the holding means in said one of the x-direction and the y-direction before actuating said other of the x-direction moving source and the y-direction moving source is opposite in direction to the movement of the holding means in said one of the x-direction and the y-direction after actuating said other of the x-direction moving source and the y-direction moving source.

6. The system of claim 5 wherein the camera means takes the images of two parts of the surface of the semiconductor wafer which are spaced from each other in said other of the x-direction and the y-direction.

7. The system of claim 6 wherein when the detecting means detects the straight-line area in both of the images of the two parts, and there is a difference in the positions in said one of the x-direction and the y-direction of the straight-line areas detected in the images of the two parts, the movement control means actuates the θ-direction moving source according to this difference to move the holding means in the θ-direction so as to make up the difference.

8. The system of claim 7 wherein when the detecting means detects the straight-line areas in both of the images of the two parts and the positions in said one of the x-direction and the y-direction of the straight-line areas detected in the images of the two parts agree with each other, the movement control means actuates said one of the x-direction moving source and the y-direction moving source to move the holding means in said one of the x-direction and the y-direction by an amount corresponding to the distance between the straight-line areas, and thereafter, the detecting means determines whether the straight-line areas exist in the corresponding positions of both of the images of the two parts taken by the camera means.

9. The system of claim 8 wherein when the detecting means cannot determine the presence of the straight-line areas, the movement control means actuates said other of the x-direction moving source and the y-direction moving source to move the holding means in said other of the x-direction and the y-direction by a predetermined distance, and thereafter, the detecting means determines whether the straight-line areas exist at positions corresponding to both of the images of the two parts taken by the camera means.

10. The system of claim 9 wherein when the detecting means can determine the presence of the straight-line areas, the movement control means actuates the $\theta$-direction moving source to move the holding means by 90 degrees in the $\theta$-direction, and thereafter the detecting means determines whether the straight-line areas exist in both of the images of the two portions taken by the camera means.

11. The system of claim 10 wherein when the presence of the straight-line areas in both of the images of the two parts can be determined, whether there is a difference between the positions in said one of the x-direction and the y-direction of the straight-line areas in the images of the two parts is detected, and if there is a difference, the movement control means actuates the $\theta$-direction moving source according to the difference to move the holding means in the $\theta$-direction.

12. The system of claim 6 wherein when the detecting means cannot detect the straight-line area in one of the images of the two parts, the detecting means detects the inclination angle of the straight-line area detected in the other of the images of the two parts to said other of the x-direction and the y-direction, and according to the detected inclination angle, the movement control means actuates the $\theta$-direction moving source to move the holding means in the $\theta$-direction so that the straight-line area becomes nearly parallel to said other of the x-direction and the y-direction.

13. The system of claim 12 wherein in detecting the inclination angle, the movement control means actuates the other of the x-direction moving source and the y-direction moving source to move the holding means at least once in the other of the x-direction and the y-direction by a predetermined distance, and the detecting means detects the inclination angle on the basis of the positions in said one of the x-direction and the y-direction of the straight-line areas in the images of at least two parts spaced from each other by said predetermined distance.

14. The system of claim 1 wherein the operation means performs differentiation on the multi-value digital signals in order to emphasize a change in density in the image taken to produce differentiated multi-value digital signals, and thresholds the differentiated multi-value digital signals with a predetermined slice level to produce the binary digital signals.

15. The system of claim 14 wherein the differentiation emphasizes a change in the density of the image either in the x-direction or the y-direction.

16. The system of claim 15 wherein the differentiation is performed by using the following differentiation mask:

| | | |
|---|---|---|
| −1 | −1 | −1 |
| 0 | 0 | 0 |
| 1 | 1 | 1 |

17. The system of claim 1 wherein the camera means is composed of solid-state camera.

18. The system of claim 17 wherein the solid-state camera has a plurality of charge-coupled devices arrayed in an x-y matrix.

19. The system of claim 1 wherein the camera means takes the image of two parts of the surface of the object which are spaced from each other.

20. The system of claim 19 wherein the two parts are spaced from each other either in the x-direction or the y-direction.

21. The system of claim 1 wherein the operation means initiates the multi-value digital signals with a predetermined slice level to produce intermediate binary digital signals, and then subjects the intermediate binary digital signals to parity check to produce the binary digital signals.

22. The system of claim 21 wherein the parity check produces processed values which distinguish the case where the intermediate binary digital signals are the same at three addresses, i.e. (x=m, y=n), (x=m+1, y=n), and (x=m, y=n+1), from the case where they are not.

23. The system of claim 1 which further includes display means for visually displaying selectively at least an image corresponding to the multi-value digital signals output by the A/D converter means and an image corresponding to the binary digital signal produced by the operation means.

24. The system of claim 23 wherein the display means is constructed of a cathode ray tube.

25. The system of claim 1 wherein the object to be worked is a semiconductor wafer having on its surface a plurality of straight-line areas of predetermined widths arranged in a lattice pattern at predetermined intervals.

26. The system of claim 1 wherein the moving means includes an x-direction moving source for moving the holding means in the x-direction, a y-direction moving source for moving the holding means in the y-direction and a $\theta$-direction moving source for moving the holding means in the $\theta$-direction.

27. The system of claim 1 wherein a magnifying optical means is disposed between the surface of the object to worked and the camera means, and the image of at least a part of the surface of the object is enlarged at a predetermined magnification by the magnifying optical means, and input into the camera means.

28. The system of claim 1 wherein the operation means initiates the multi-value digital signals with a predetermined slice level to produce the binary digital signals.

* * * * *